United States Patent
Wan

[19]

[11] Patent Number: 6,069,847
[45] Date of Patent: May 30, 2000

[54] TIMER

[75] Inventor: David Wan, Hsin Tien, Taiwan

[73] Assignee: King-I Electromechanical Industry Co., Ltd., Taipei Hsien, Taiwan

[21] Appl. No.: 09/013,924

[22] Filed: Jan. 27, 1998

[51] Int. Cl.[7] .......................... G04B 37/00; G04C 29/02; G04F 8/00; H01H 7/08
[52] U.S. Cl. .......................... 368/88; 368/107; 200/38 R
[58] Field of Search ..................... 368/107–109; 200/36, 38 R, 38 A, 38 D, 38 FB; 307/141, 141.4

[56] References Cited

U.S. PATENT DOCUMENTS

| | | | |
|---|---|---|---|
| 3,754,107 | 8/1973 | Balchunas | 200/38 A |
| 3,824,418 | 7/1974 | Balchunas | 200/38 A |
| 3,925,629 | 12/1975 | Albinger, Jr. | 200/38 P |
| 3,997,742 | 12/1976 | Marquis | 200/38 FB |

*Primary Examiner*—Vit Miska
*Attorney, Agent, or Firm*—Bacon & Thomas

[57] ABSTRACT

A timer has an upper cover, a mounting base and a circuit board. The space between the upper cover and the mounting base is used to accommodate the circuit board. The upper cover and the mounting base are fixed together by way of fixing poles and screws. At one side of the circuit board is disposed a number of conducting legs some of which are integrally formed and coupled to the connecting pins of electronic components by welding and are secured to the circuit board at the same time so that the assembly of the timer of the present invention is time saving in production and safer in use.

1 Claim, 5 Drawing Sheets

TIMER

BACKGROUND OF THE INVENTION

The present invention relates to an improved timer having an upper cover, a mounting base and a circuit board. The space between the upper cover and the mounting base is used to accommodate the circuit board. The upper cover and the mounting base are fixed together by way of fixing poles and screws. At one side of the circuit board is disposed a number of conducting legs some of which are integrally made and coupled to the connecting pins of electronic components by welding and are secured to the circuit board at the same time so that the assembly of the timer of the present invention is time saving in production and safer in use.

Referring to FIG. 1, the convent ional timer has an upper cover 10, a base casing 20 and a receiving space 11 is defined in the upper cover 10 for housing a circuit board 12 on which various electronic components are placed. On one side of the circuit board are disposed a number of conducting legs 13 having respectively one end coupling to a power source and the other end connected to the circuit board 12 and welded to the pins of various electronic components according to the layouts of the original design. Such a prior art timer has the following disadvantages in production and practical use:

1. the conducting legs led through the circuit board are coupled to the pins of various electronic components by welding; however, such a way of connection is time and labor consuming, causing inconvenience in production;
2. the wiring of such a timer is relatively complex, resulting in the complicated layout of the circuit board and causing errors in wiring process;
3. manual labor or automatic equipment is used to effect the welding task, making the cost of investment and production high.

SUMMARY OF THE INVENTION

Therefore, the primary object of the present invention is to provide an improved timer in which the circuit board is provided with a number of conducting legs some of which are integrally connected to each other so as to avoid the complex layout of a circuit board and the unnecessary wiring in production, preventing Wiring errors from happening in production. It is a cost and labor saving, secure way of massive production of timers in practical use.

DETAILED DESCRIPTION OF THE PREFERRED EMBODIMENT

Figure 1:
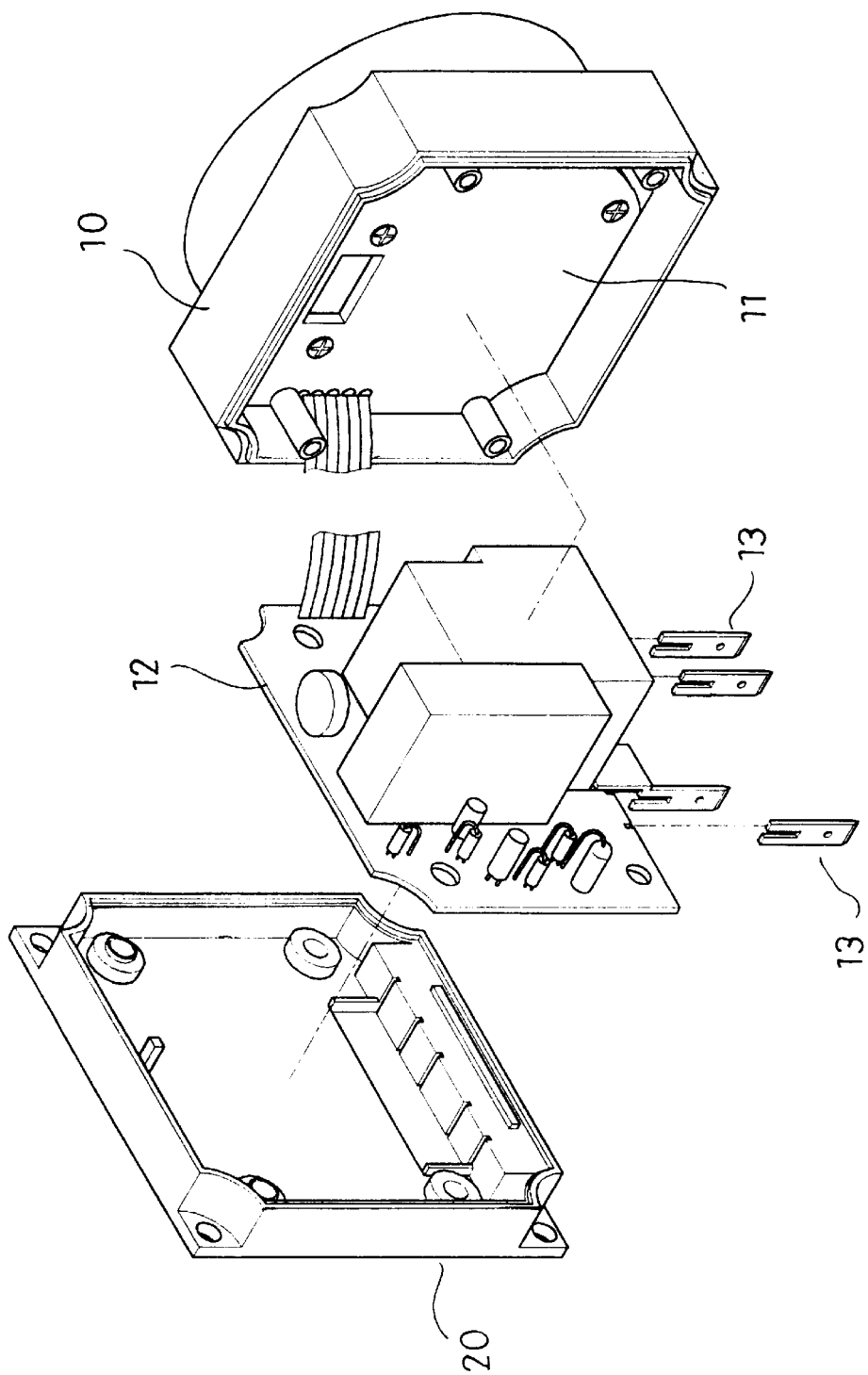
FIG. 1 is a perspective diagram showing the exploded components of a prior art timer.
Figure 2:
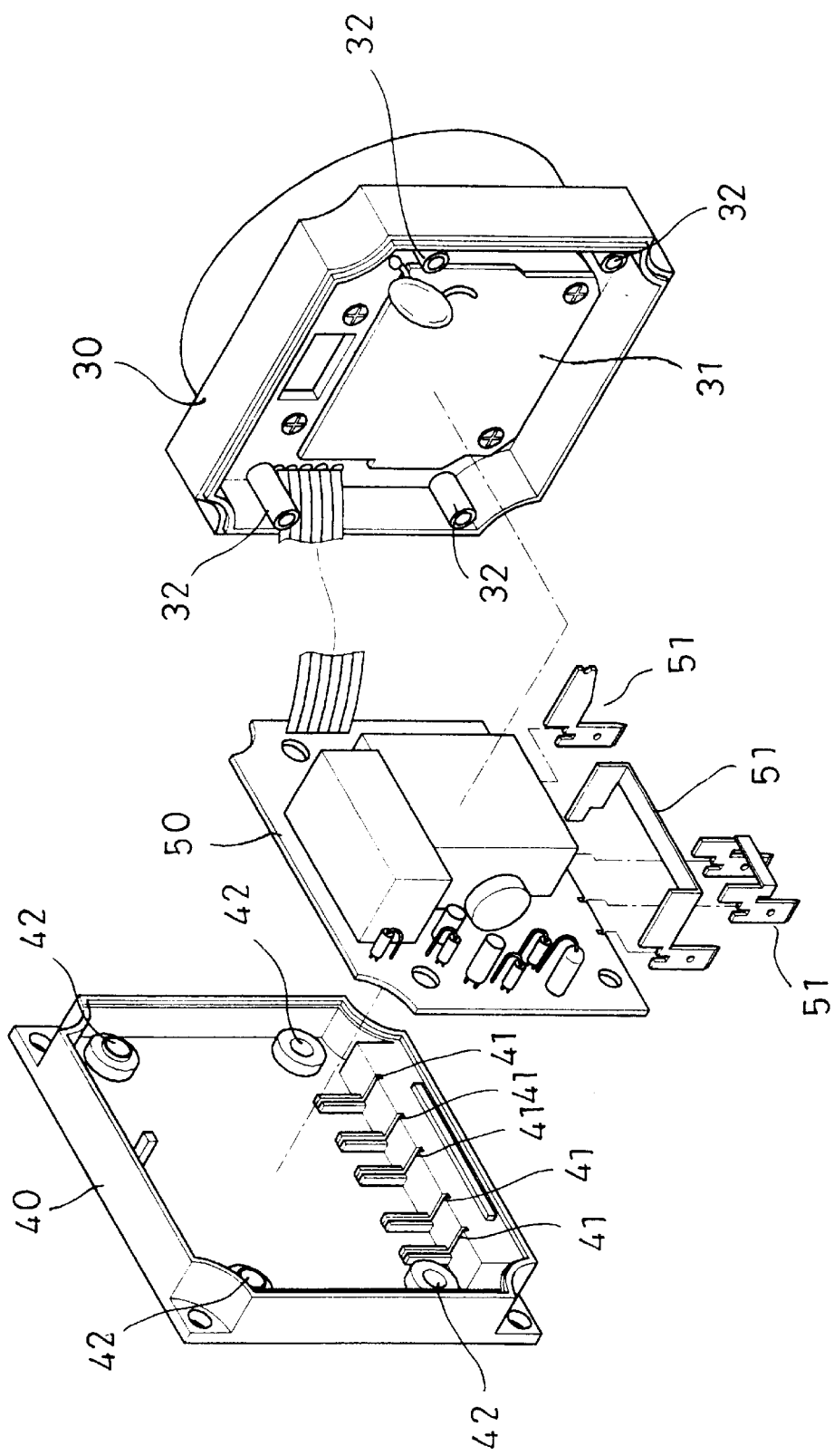
FIG. 2 is a perspective diagram showing the exploded components of the present invention.
Figure 3:
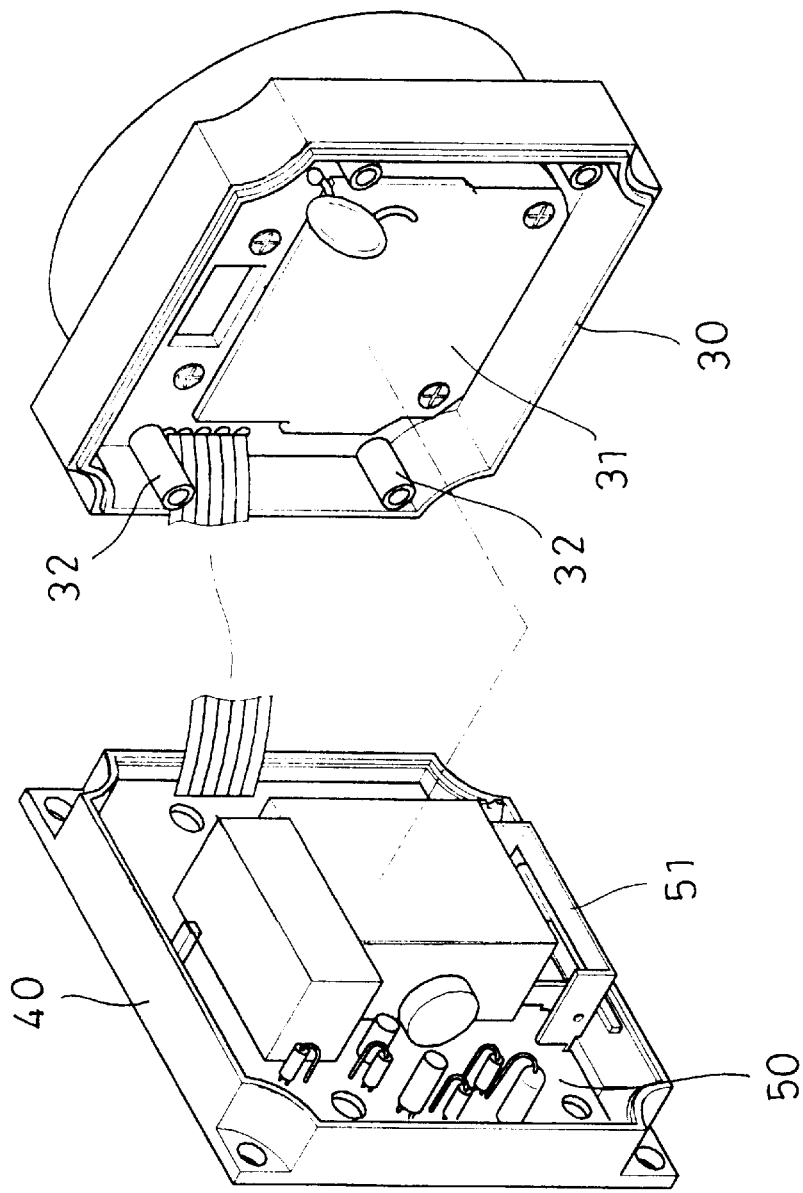
FIG. 3 is a diagram showing the assembly of the present invention.
Figure 4:
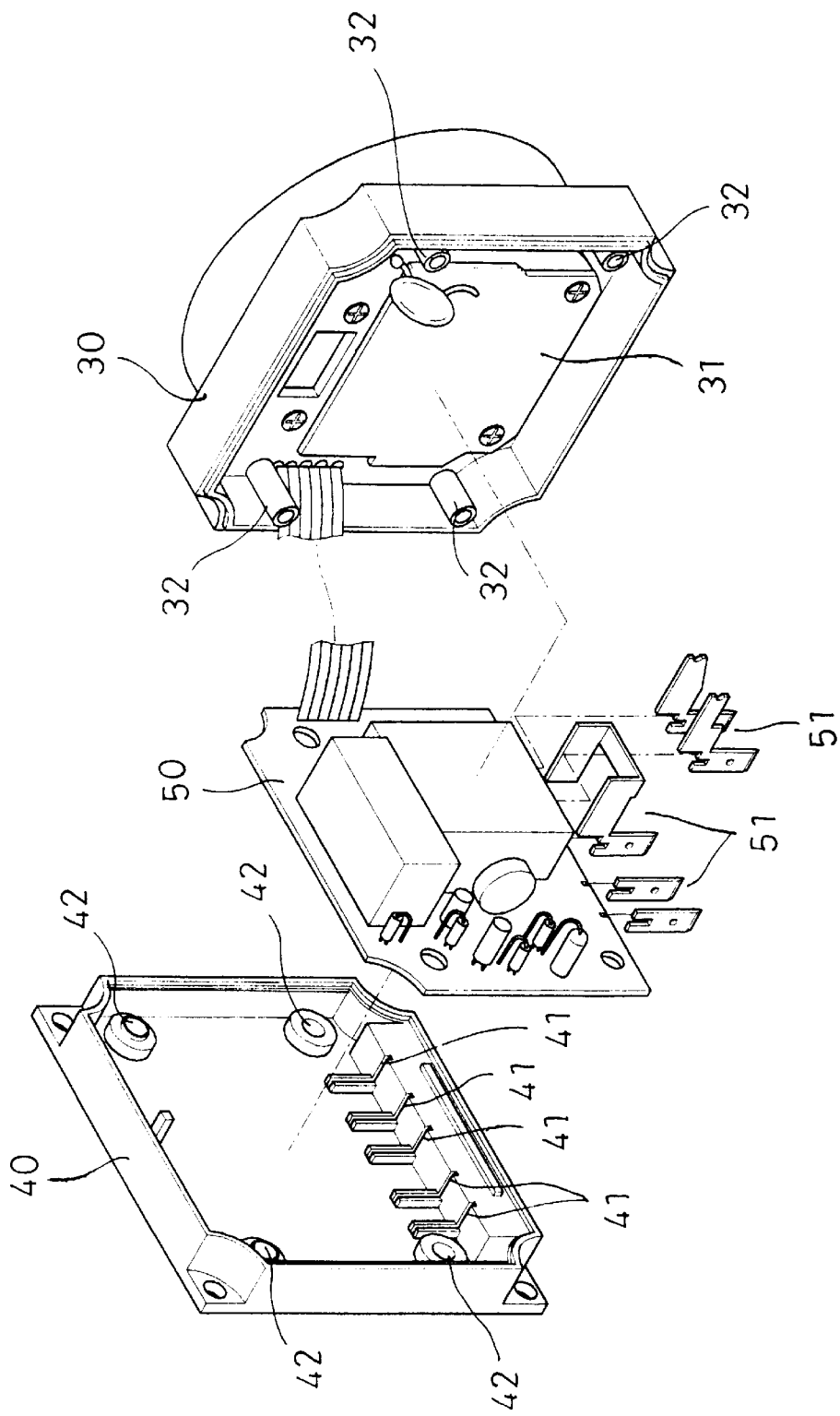
FIG. 4 is a perspective diagram showing the exploded components of another embodiment of the present invention.
Figure 5:
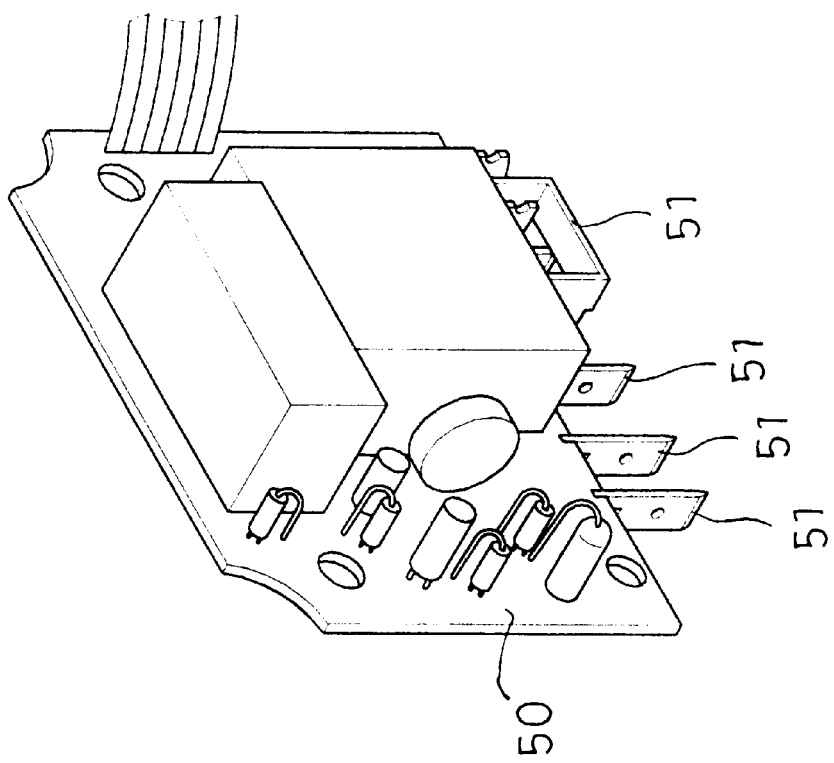
FIG. 5 is a diagram showing the partial assembly of the timer shown in FIG. 4.

Referring to FIG. 2 to FIG. 5, the timer of the present invention is made up of an upper cover 30, a mounting base 40 and a circuit board 50.

The upper cover 30 of a rectangular shape has a receiving cavity 31 for the placement of an IC board, There are four fixing poles 32 disposed on the upper cover 30 with each fixing pole 32 located at one corner of the cover 30 so as to permit the circuit board 50 to be secured in place to the upper cover 30 by way of screws.

The mounting base 40 is provided with a number of slots 41 on one side thereof for the insertion of corresponding conducting legs 51. At each corner of the mounting base 40 is disposed a through hole 42 in correspondence to each fixing post 32 of the upper cover 40 so as to permit screws to go therethrough and engage with the fixing post in assembly of the upper cover 30 to the mounting base 40.

In the space defined between the assembled upper cover 30 and the mounting base 40 is housed the circuit board 50 which functions to set time by way of the buttons disposed on the front face of the upper board 30, and the current time can be displayed by an LCD on the front face of the upper board 30. The circuit board 50 is provided with various kinds of electrical components thereon. A plurality of conducting legs 51 are connected by welding to the electrical components at one end and are engaged with a power source at the other end. The conducting legs 51 are of an L shape with some coupled to each other.

In assembly, the circuit board 50 is first placed in the mounting base 40 with the conducting legs 51 inserted into the slots 41 defined on one side of the mounting base 40, and then the upper cover 30 is fixedly engaged with the mounting base 40 by screws led through the through holes 42 of the mount ing base 40 and locked in place in the respective locking posts 42 to complete the assembly.

There are a number of features associated with the present invention. First, the circuit board is simplified with its circuit design and the conducting legs are in direct connection to electrical components by welding in one aspect, and some of the conducting legs are integrally formed so as to simplify the task of welding the conducting legs piece by piece with the circuit board first and by way of the design of the circuit board of the present invention, the circuit board of a conventional timer can be effectively simplified, facilitating the assembly and lowering the production cost

I claim:

1. An improved time, comprising an upper cover, a mounting base, and a circuit board, wherein said upper cover is provided with a number of fixing posts on a periphery thereof that are arranged to fix said mounting base and said circuit board in place; said mounting base is provided with a number of through holes in correspondence to said fixing posts of said upper cover so as to permit screws to be led therethrough to fix said upper cover and said mounting base together; and said circuit board is accommodated in a space defined between said upper cover and said mounting base;

wherein one side of said circuit board is provided with a plurality of L-shaped conducting legs having first ends arranged to be connected to a power source and second ends coupled directly to electronic components of said circuit board by welding; and wherein at least two of said L-shaped conducting legs are integrally connected to each other.

* * * * *